United States Patent
Sonwalkar

(10) Patent No.: US 10,935,707 B1
(45) Date of Patent: Mar. 2, 2021

(54) OPTICAL COATING FOR SPECTRAL CONVERSION

(71) Applicant: SunDensity Inc., Boston, MA (US)

(72) Inventor: Nishikant Sonwalkar, Boston, MA (US)

(73) Assignee: SunDensity, Inc., Boston, MA (US)

( * ) Notice: Subject to any disclaimer, the term of this patent is extended or adjusted under 35 U.S.C. 154(b) by 0 days.

(21) Appl. No.: 17/064,699

(22) Filed: Oct. 7, 2020

Related U.S. Application Data

(60) Provisional application No. 62/913,315, filed on Oct. 10, 2019.

(51) Int. Cl.
| | |
|---|---|
| *G02B 1/10* | (2015.01) |
| *G02B 5/26* | (2006.01) |
| *C09K 11/59* | (2006.01) |
| *H01L 31/055* | (2014.01) |

(52) U.S. Cl.
CPC ............... *G02B 5/26* (2013.01); *C09K 11/59* (2013.01); *G02B 2207/101* (2013.01); *H01L 31/055* (2013.01)

(58) Field of Classification Search
CPC .... G02B 5/26; G02B 2207/101; C09K 11/59; H01L 31/05
USPC .......................................................... 359/584
See application file for complete search history.

(56) References Cited

U.S. PATENT DOCUMENTS

| | | | |
|---|---|---|---|
| 4,891,075 A | 1/1990 | Dakubu | |
| 9,954,128 B2 | 4/2018 | King et al. | |
| 2007/0295383 A1 | 12/2007 | Li et al. | |
| 2010/0013253 A1* | 1/2010 | Winzinger | B65G 17/323 294/87.1 |
| 2010/0126566 A1 | 5/2010 | Ji | |
| 2010/0288352 A1* | 11/2010 | Ji | H01L 31/0547 136/256 |
| 2011/0126889 A1* | 6/2011 | Bourke, Jr. | H01L 31/055 136/253 |

(Continued)

OTHER PUBLICATIONS

Mehrvar, L., Sadeghipari, M., Tavassoli, S.H. et al. "Optical and Surface Enhanced Raman Scattering properties of Ag modified silicon double nanocone array". Sci Rep 7, 12106 (2017). https://doi.org/10.1038/s41598-017-12423-2 (Year: 2017).*

(Continued)

*Primary Examiner* — William R Alexander
*Assistant Examiner* — Tamara Y. Washington
(74) *Attorney, Agent, or Firm* — Louis S. Horvath

(57) ABSTRACT

An optical coating has a set of layers to reflect a predetermined range of wavelengths, the set of layers including two or more pairs of alternating first and second layers, the first layers having a first refractive index, $n_1$, and the second layers having a second refractive index, $n_2$, greater than the first refractive index $n_1$. The second layers each include a first distribution of nanoparticles of a first material. The layers exhibit a spectral characteristic that shifts a portion of the incident light to a first range of wavelengths and that directs light of the first range of wavelengths to a surface-enhanced Raman scattering (SERS) layer. The SERS layer is configured with a second distribution of conductive nanoparticles of a second material to further shift the light of the first range of wavelengths to a second range different from the first range, according to the second distribution of nanoparticles.

19 Claims, 9 Drawing Sheets

(56) References Cited

U.S. PATENT DOCUMENTS

| | | | |
|---|---|---|---|
| 2012/0037228 A1 | 2/2012 | Fu | |
| 2012/0080067 A1* | 4/2012 | Tsakalakos | C09K 11/025 |
| | | | 136/244 |
| 2013/0081693 A1 | 4/2013 | Kaufman | |
| 2016/0133770 A1* | 5/2016 | Meusel | H01L 31/056 |
| | | | 136/246 |

OTHER PUBLICATIONS van Dijk et al., "Competition between Extinction and Enhancement in Surface-Enhanced Raman Spectroscopy", Physical Chemistry Letters, American Chemical Society, 2013. pp. 1193-1196.

A. Bouali, S. Haxha, F. Abdelmalek, M. Dridi, and H. Bouchriha, "Tuning of Plasmonic Nanoparticle and Surface Enhanced Wavelength Shifting of a Nanosystem Sensing Using 3-D-FDTD Method", IEEE Journal of Quantum Electronics vol. 50, No. 8 (Aug. 2014), pp. 651-657.

Chen, A., Yuan, Q., and Zhu, K., (2016), "ZnO/a-Si Distributed Bragg Reflectors for Light Trapping in Thin Film Solar Cells from Visible to Infrared Range", App. Surface Science, 360, Part B, pp. 693-697.

Peter Bermel, Chiyan Luo, Lirong Zeng, Lionel C. Kimerling, and John D. Joannopoulos, "Improving thin-film crystalline siliconsolar cell efficiencies with photonic crystals" Dec. 10, 2007 / vol. 15, No. 25 / Optics Express, pp. 16986-17000.

Cameron Stanley, Ahmad Mojiri, and Gary Rosengarten, "Spectral light management for solar energy conversion systems" Nanophotonics (2016), vol. 5, No. 1; pp. 161-179.

U.S. Appl. No. 17/064,773, filed Oct. 7, 2021, "Method and Apparatus for Increased Solar Energy Conversion".

* cited by examiner

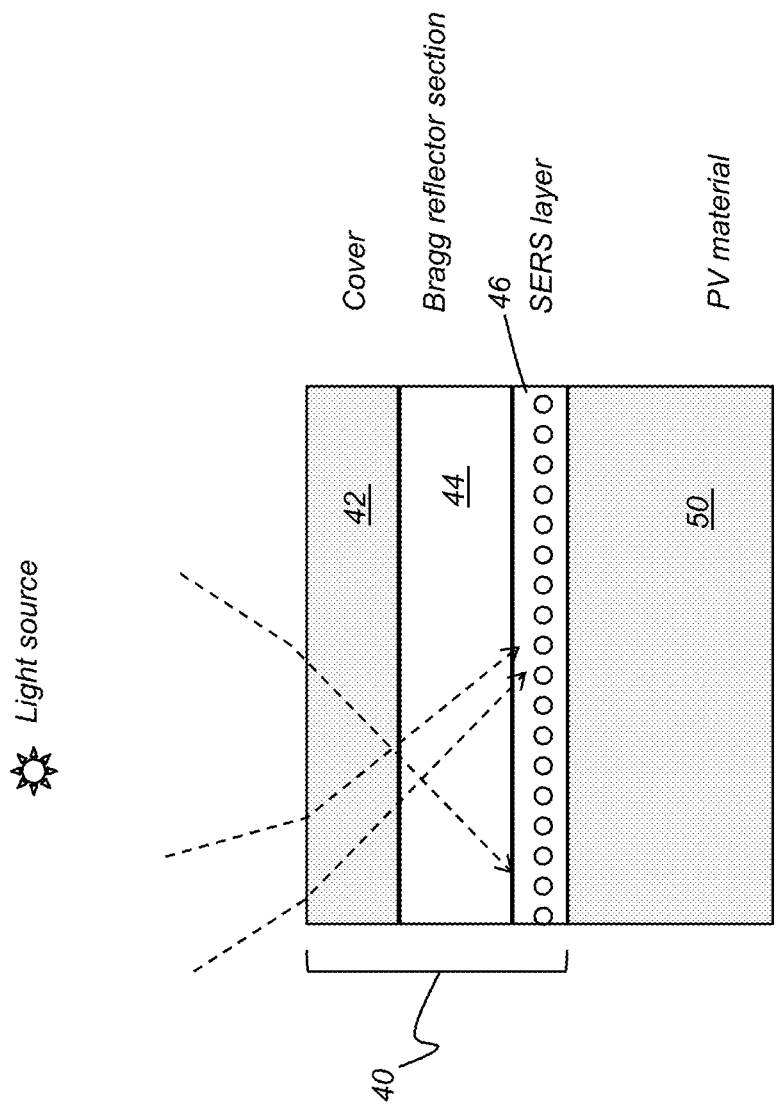

OPTICAL COATING FOR SPECTRAL CONVERSION

CROSS REFERENCE TO RELATED APPLICATIONS

This application claims the benefit of U.S. Provisional application U.S. Ser. No. 62/913,315 provisionally filed on 10 Oct. 2019, entitled "OPTICAL COATING FOR SPECTRAL CONVERSION", in the name of Nishikant Sonwalkar, incorporated herein in its entirety.

TECHNICAL FIELD

This invention generally relates to spectral performance of an optical medium and more particularly to optical coatings for spectral re-mapping of incident light energy.

BACKGROUND ART

Each type of light-propagating optical material has a characteristic spectral response to light energy that can vary over a band of wavelengths. Conventional optical glass types, for example, exhibit optimum transmission over a given range, but can show less efficient transmission at particular wavelengths. Optical coatings of various types have variable response and efficiencies at particular wavelength ranges. Photonic sensors and energy converters, such as photovoltaic (PV) solar energy converters, can be much more efficient over some wavelength bands than at others.

Photonic conversion methods have been proposed and used for compensating and adjusting spectral response for different types of optical components and materials. Methods for up-conversion (UC), down-conversion (DC), and other types of spectral response modification have been developed for altering the inherent response of particular light-propagating optical materials in the hope of achieving measurable and useful performance improvements.

While some headway has been made in improving the efficiency of light transmission, particularly in the PV solar energy field, appreciable problems remain. Among limitations faced in improving spectral response for PV applications in particular, and for light-propagating materials in general, are problems related to the materials used to fabricate components that provide UC or DC functions. Attempts to improve the efficiency of photovoltaics, for example, are characterized by costly and/or environmentally unfavorable materials. Lanthanides and rare-earth materials have been particularly noted as candidates for improving spectral response for light-propagating optical materials. However, these materials must be carefully handled in order to achieve results that justify expense, fabrication, and potential waste-disposal difficulties. Quantum-dot materials are subject to the same problems and introduce a number of environmental safety concerns that can hinder their application with photovoltaics.

In addition to materials-related limitations, there are also known practical principles for energy conversion that have been widely accepted by those skilled in the optical materials arts, including principles related to heat generation and other practical limitations.

Thus, it can be appreciated that there is room for improvement for methods related to improved spectral performance and engineering of light-propagating optical materials.

SUMMARY OF INVENTION

It is an object of the present disclosure to advance the optical materials arts, with respect to engineering the spectral response of light propagating materials over a wavelength range. With this object in mind, the present disclosure provides an optical coating comprising:

a set of layers formed to reflect a predetermined range of wavelengths, the set of layers including two or more pairs of alternating first and second layers, the first layers having a first refractive index, $n_1$, and the second layers having a second refractive index, $n_2$, greater than the first refractive index $n_1$, wherein the second layers each include a first distribution of nanoparticles of a first material, wherein the set of layers exhibit a spectral characteristic that shifts a portion of incident light wavelengths to a first range of wavelengths and that conveys light of the first range of wavelengths to a surface-enhanced Raman scattering layer;

wherein the surface-enhanced Raman scattering layer is configured with a second distribution of nanoparticles of a second material to further shift the light of the first range of wavelengths to a second range of wavelengths different from the first range, according to the second distribution of nanoparticles in the Raman scattering layer.

An advantage provided by apparatus and methods of the present disclosure is the capability to formulate and use materials that are much less environmentally objectionable than those proposed for spectral efficiency improvement.

Other desirable objectives, features, and advantages of the disclosed invention may occur or become apparent to those skilled in the art. The invention is defined by appended claims.

INDUSTRIAL APPLICABILITY

According to a broad aspect of the present disclosure, apparatus and methods are provided for achieving improved spectral response of light-propagating optical materials, including materials useful in solar energy generation and other photovoltaic applications.

BRIEF DESCRIPTION OF DRAWINGS

FIG. 4 is a schematic side view showing a multi-layered coating for down-conversion of light energy.

DESCRIPTION OF EMBODIMENTS

Figure 1:
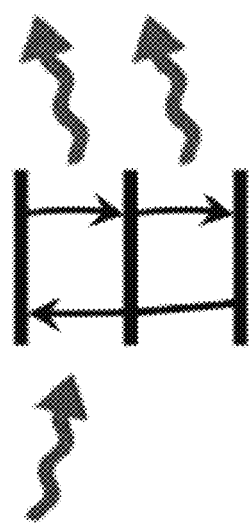
FIG. 1 is a simplified schematic showing down conversion.

Figures shown and described herein illustrate key principles of operation and fabrication for an optical apparatus according to various embodiments and are not drawn with intent to show actual size or scale. Some visual exaggeration may be necessary in order to emphasize basic structural relationships or principles of operation.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light in different planes, for example, but do not indicate any required orientation of components with respect to true horizontal and vertical orientation.

Where they are used, the terms "first", "second", "third", and so on, do not necessarily denote any ordinal or priority relation, but are used for more clearly distinguishing one element or time interval from another. For example, there are no fixed "first" or "second" elements in what is taught herein; these descriptors are merely used to clearly distinguish one element from another similar element in the context of the present disclosure.

In the context of the present disclosure, the term "film" can be used to mean a coating that is applied to a substrate as one or more thin layers, such as a thin-film optical coating formed from successively formed layers of materials treated to have different indices of refraction. A film can also be a sheet of a light-propagating substrate formed of one or more layers of optical materials and used in standalone fashion or optically coupled to another optical component, such as using an adhesive.

As used herein, the term "energizable" relates to a device or set of components that perform an indicated function upon receiving power and, optionally, upon receiving an enabling signal. A "light-propagating" material transmits or conveys the bulk of the light, at least more than 50%, received by the material. For most uses of the apparatus of the present disclosure, the range of interest for light propagation is generally between about 200 nm and 2200 nm.

The term "nanoparticle" generally refers to particles that have an intermediate size between individual atoms and macroscopic bulk solids, with an average diameter between about 1 nm to 100 nm. Nanoparticle size for a material is typically on the order of the Bohr exciton radius, or the de Broglie wavelength of the material, which may allow individual nanoparticles to trap individual or discrete numbers of charge carriers, either electrons or holes, or excitons, within the particle. The spatial confinement of electrons (or holes) by nanoparticles is believed to alter the physical, optical, electronic, catalytic, optoelectronic and magnetic properties of the material.

FIG. 1 shows, in simplified schematic form, the mechanism of spectral down-conversion, in which a high energy photon is converted to two lower energy photons. Conventional solutions for providing spectral conversion of this type in a light-propagating material rely heavily on lanthanide materials. In PV applications, for example, the uses and advantages of lanthanide elements for performing down-conversion are well-understood. The availability of electrons in various states that is characteristic of the lanthanides makes these substances readily usable for down-conversion applications, allowing light energy to be more usable with various types of sensing and for electrical current generation. Other elements, meanwhile, do not enjoy this inherent advantage and would not be considered as candidate materials for fabricating a down-conversion article.

Lanthanide materials, however, present a number of problems in cost, availability, handling, and introduce a number of environmental concerns. Lanthanides also show considerable losses that constrain how much improvement can be obtained.

The Applicant's approach for improved efficiency of spectral conversion and conditioning does not depend on lanthanides or phosphor-based light generation in order to shift the wavelength of light for improved efficiency. Instead, the Applicant has identified a novel sequence for light handling and conversion along with a corresponding layered structure that can be engineered to provide the down-conversion that is most useful for photovoltaic applications, as well as up-conversion and spectral shifting and refinement in general. The Applicant's technique applies quantum matching to the problem of wavelength shifting, forming a multilayered structure that takes advantage of both properties of Bragg reflection and efficiencies of localized surface plasmon resonance (LSPR) and surface enhanced Raman scattering (SERS).

Light-Handling for Down-Conversion

Figure 2:
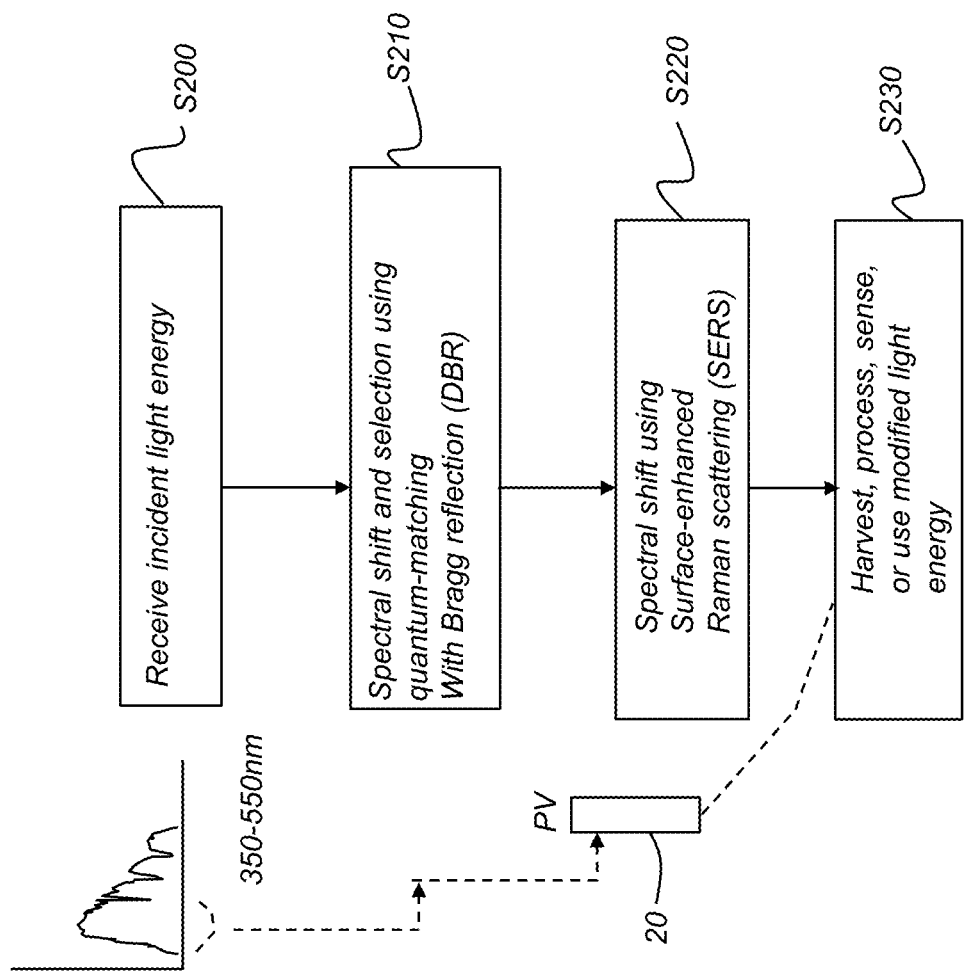
FIG. 2 is a flow diagram that shows a sequence for light handling that provides down-conversion for PV applications.

The flow diagram of FIG. 2 shows a sequence for light handling that provides down-conversion or other types of spectral shifting. According to an exemplary embodiment, this sequence can be used for shifting a portion of the higher energy UV and visible light to the lower energy bandgap range of a conventional silicon PV cell, 1064 nm. The sequence achieved by the Applicant's coating is as follows:

(i) Step S200: Receive incident light energy. For incident sunlight, for example, most of the irradiance is within the visible region, roughly between about 450-700 nm.

(ii) Step S210: Perform a spectral shift and selection using distributed Bragg reflection (DBR) with quantum confinement.

(iii) Step S220: Perform a further spectral shift using surface-enhanced Raman scattering (SERS).

(iv) Step S230: Harvest, process, sense, or otherwise use the light, including the spectrally shifted light, such as at a PV converter 20 or a sensor.

Figure 3A:
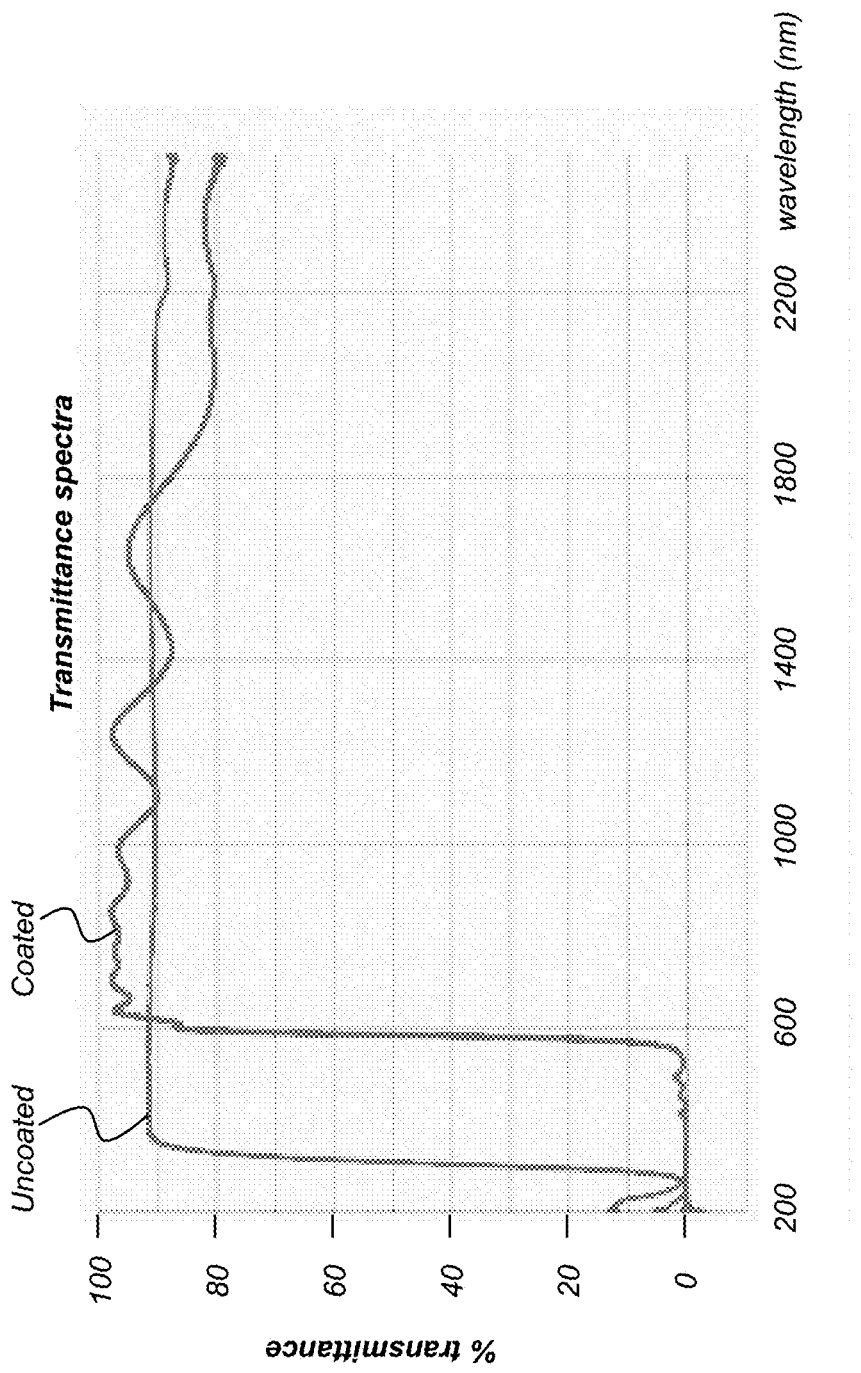
FIG. 3A is a graph that shows improved spectral response for a coated light-propagating material according to an embodiment of the present disclosure.
Figure 3B:
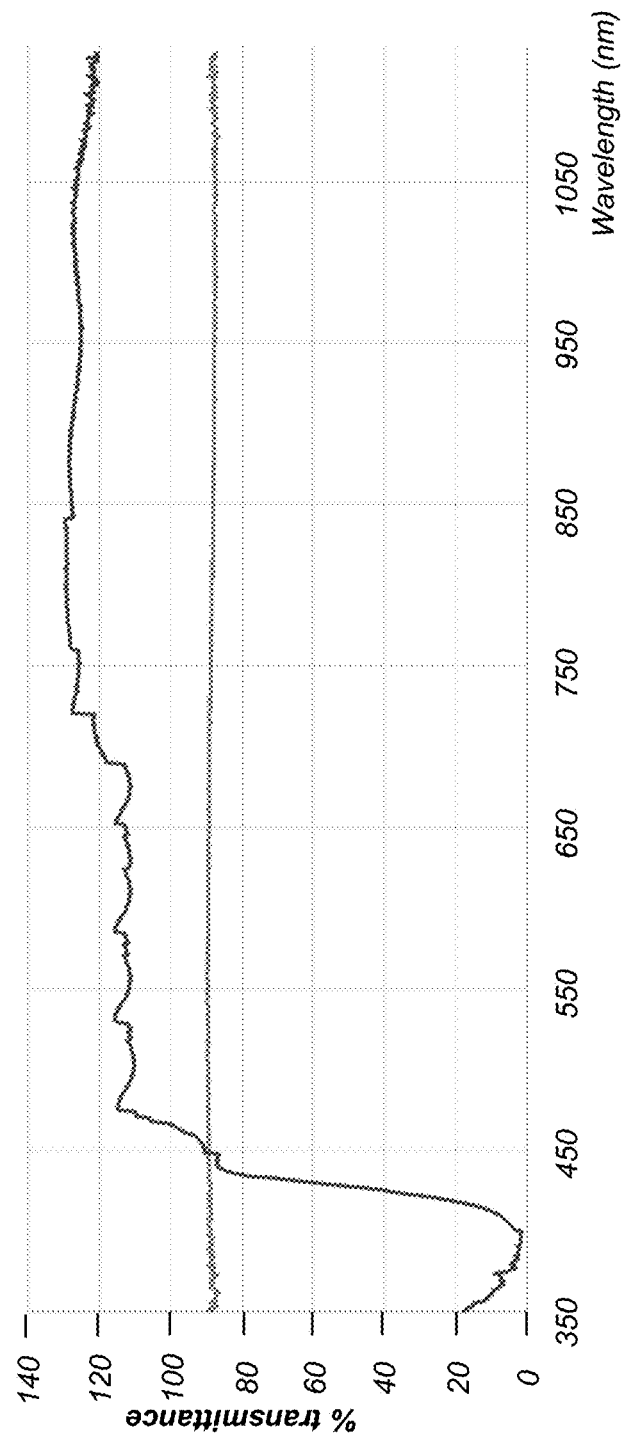
FIG. 3B is a graph that shows improved spectral response for a coated light-propagating material compared against pane glass transmission according to an embodiment of the present disclosure.

The graph of FIG. 3A compares the transmission spectra of an uncoated optical glass with the transmission spectra of the same glass material having a coating formed according to an embodiment of the present disclosure. As can be see, the transmission efficiency is enhanced for higher wavelength light. This enhancement can be beneficial for PV applications, for example. FIG. 3B shows improved spectral response for a coated light-propagating material compared against pane glass transmission according to an embodiment of the present disclosure.

Figure 3C:
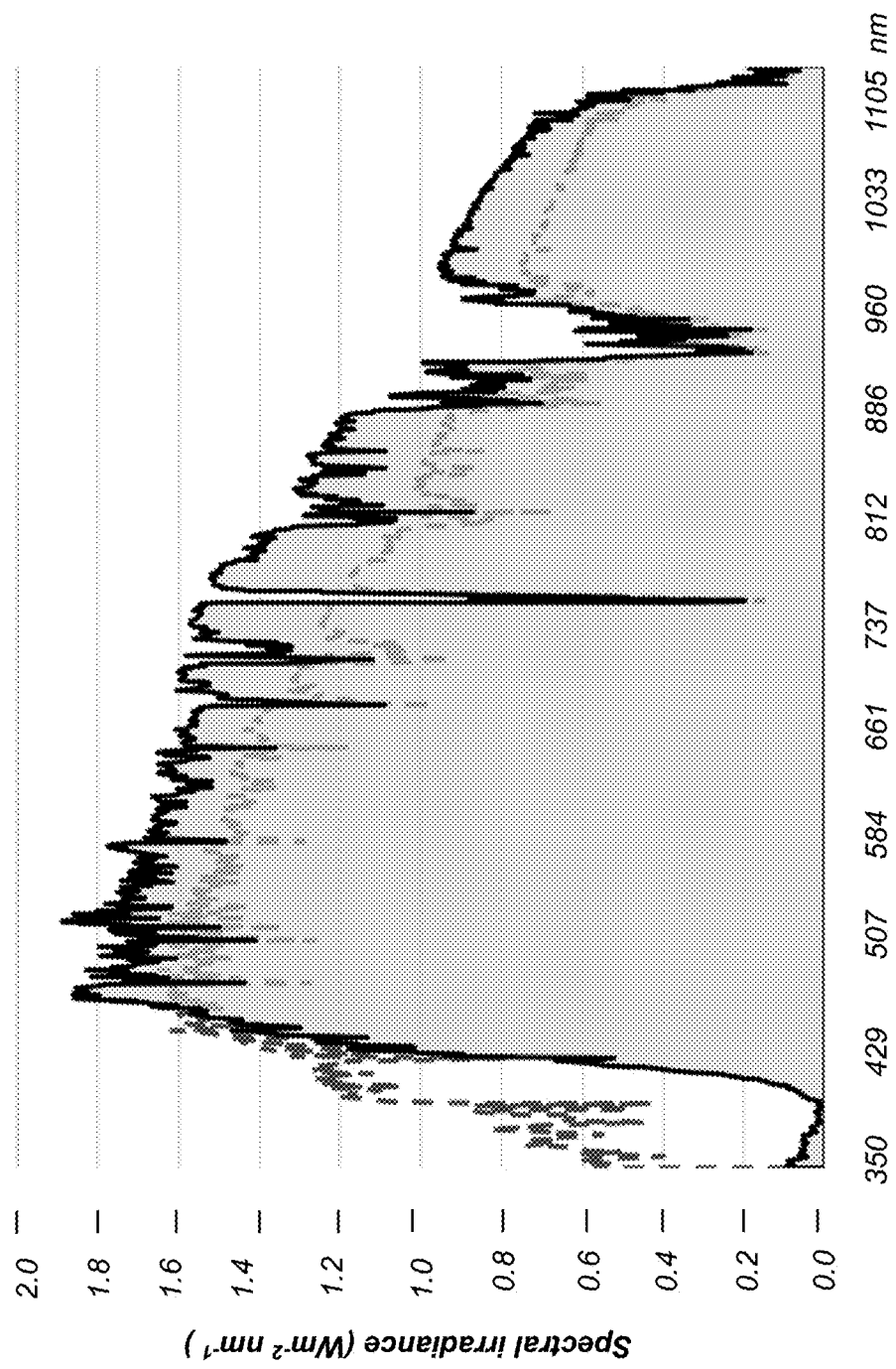
FIG. 3C is a graph that shows spectral irradiance for incident light and for light that has been spectrally shifted by propagation through the coating of the present disclosure.

The graph of FIG. 3C shows spectral irradiance for incident light in air (dashed line) and for light that has been spectrally shifted by propagation through the coating of the present disclosure (full line). Shading shows the corresponding shift in energy distribution and change in overall power density.

The cross-section of FIG. 4 shows, in schematic form and not to scale, an arrangement of layers that can be used to provide a coating 40 that has the described spectral behavior for down-conversion of light energy in a PV application, with the light incident from above in the orientation shown.

A cover 42 is formed from a light-propagating material, typically glass or plastic. A modified distributed Bragg reflector (DBR) section 44 is a multilayer structure that provides the first spectral shift with selection noted in the FIG. 2 sequence by effectively changing the coherence length of a portion of the incident light. The spectrally shifted light is then directed to a surface-enhanced Raman scattering (SERS) layer 46, wherein subsequent spectral shifting takes place. The resulting light energy, shifted toward the bandgap desired, such as bandgap of a PV device for example, can then be directed to a PV material or other substrate 50.

Structure and Composition of Bragg Reflector Section 44

Embodiments of the present disclosure use principles of distributed Bragg reflection (DBR), modified for quantum matching, as described following. It must be noted that Bragg reflection, of itself, does not cause a spectral shift, but is rather used for selective reflection of a narrow portion of the spectrum. The DBR is generated as incident light is conveyed through periodic layers of different refractive index material that form a 1-D photonic crystal. DBR employs a wave optics approach that is targeted to enhance photons within a range considered most useful. Structures and use of DBR for selective enhancement of photon energy within a photonic bandgap (PBG) are described, for example, in the following articles:

- Ding, Y., Chen, P, Fan, H. Q., and Hou G., (2017), "Photonic Structure for Light Trapping in Thin Films Silicon Solar Cells: Design and Experiment", *Coatings*, 7, 236;
- Chen, A., Yuan, Q., and Zhu, K., (2016), "ZnO/a-Si Distributed Bragg Reflectors for Light Trapping in Thin Film Solar Cells from Visible to Infrared Range", *App. Surface Science*, 360, Part B, pp. 693-697; and
- Peter Bermel, Chiyan Luo, Lirong Zeng, Lionel C. Kimerling, and John D. Joannopoulos, "Improving thin-film crystalline siliconsolar cell efficiencies with photonic crystals" 10 Dec. 2007/Vol. 15, No. 25/*OPTICS EXPRESS*, pp. 16986-17000.

By way of illustration, it has been demonstrated that a quarter wavelength ZnO/a-Si alternating stack with only six periods can exhibit a peak reflectance of 99%. A six-period reverse ZnO/a-Si can have reflectivity of 98%; the combination of two ZnO/a-Si DBRs can be adapted to a broader stopband, such as from 686 nm to 1354 nm.

In order to better understand the additional shifting mechanism that is formed within the Bragg reflector structure, it is useful to review some basic principles of Bragg reflection. The distributed Bragg reflector arrangement can alternately be considered a 1-D photonic crystal, formed as a periodic arrangement of stacked microstructures that collectively define particular energy bands.

Figure 5:
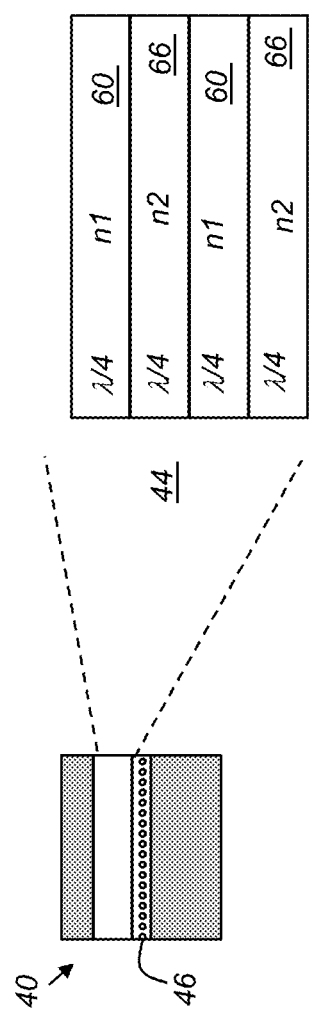
FIG. 5 is a side view schematic diagram that shows the layered arrangement for Bragg reflection used in a down-conversion coating.
Figure 6:
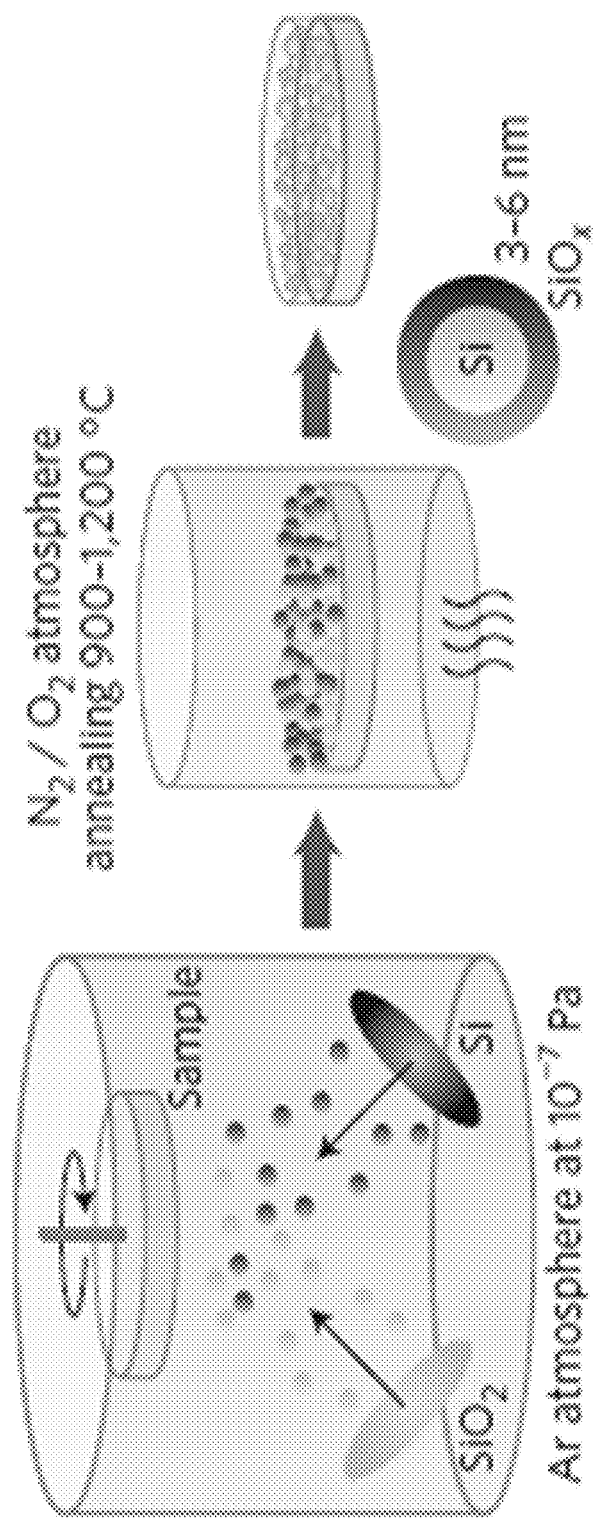
FIG. 6 shows a sequence for additive fabrication and forming in situ nanoparticles within the coating.

The schematic side view of FIG. 5 and exploded view of FIG. 6 show an arrangement of multiple layers 60, 66 for Bragg reflector section 44 according to an embodiment. As noted previously, Bragg reflector section 44 is formed as a quarter-wave stack that provides a photonic crystal. A sequence of transparent layers, overlaid on one another, has alternate layers having alternating indices of refraction, with indices shown respectively as n1, n2. Four layers are shown by way of example in FIG. 5; additional layers could alternately be used for forming a Bragg reflector with given spectral response. According to an embodiment, 6-12 periods are used, each period having a pair of layers of alternate indices. The periodic variation in refractive index can be provided by layers having $\lambda/4$ thickness, wherein, wavelength $\lambda$ is at a suitable wavelength for the particular application. According to an exemplary embodiment of the present disclosure, the target Bragg wavelength $\lambda$ is about 600 nm.

Layer thickness, alternating slightly between values d1 and d2 for the different materials that have respective indices n1 and n2, can provide Bragg reflection at a Bragg wavelength $\lambda_B$, with the alternating thickness values given by:

$$d_1 = \frac{1}{4}\frac{\lambda_B}{n_1}$$

$$d_2 = \frac{1}{4}\frac{\lambda_B}{n_2}$$

With silicon (Si), layer thickness d1, d2 is typically in the 60 nm range.

The period A of the Bragg layer sequencing can be expressed:

$$\Lambda = d_1 + d_2 = \frac{\lambda_B}{2}\left[\frac{1}{2n_1} + \frac{1}{2n_2}\right]$$

or $$\Lambda = \frac{1}{2}\frac{\lambda_B}{\bar{n}} \text{ wherein } \bar{n} = \left[\frac{n_1 + n_2}{2}\right]$$

Thus, $$\frac{1}{\bar{n}} = \frac{1}{2}\left(\frac{1}{n_1} + \frac{1}{n_2}\right)$$

With a Bragg reflection wavelength:

$$\lambda_B = 2\bar{n}\Lambda_B$$

a propagation constant can be obtained:

$$\beta_B = \frac{2\pi}{\lambda_B/\bar{n}} = \frac{\pi}{\Lambda_B}$$

For light at wavelength:

$$\lambda_B: \Delta\beta = \beta - \beta_B$$

For light in phase with the grating, the difference between indices n1 and n2 is relatively small. At the Bragg wavelength, transmission loss can be exceptionally low; reflectivity at this wavelength can exceed 99.99%.

Other, more conventional proposed solutions for handling light to or within photovoltaic devices use Bragg reflectance to trap or otherwise contain the incident light, but lack the capability to provide a wavelength shift. Embodiments of the present disclosure address the problem of wavelength shifting using quantum matching in forming the distributed Bragg reflector structure. In a quantum-confined Bragg grating, the reflector arrangement maintains light energy at an antinode, for enhancement of optical gain by a factor of 2.

According to an embodiment, quantum confinement or quantum matching is achieved using a distribution of silicon (Si) nanoparticles/nanocrystals embedded within a silicon oxide (SiO2) substrate. Spaces between the distributed nanoparticles form vertical cavities within the SiO2 substrate ("vertical" extending in a direction generally orthogonal to the plane of layers and of the PV device surface). Resonance of the light signal within the cavities results in coherence of the light, at frequencies (wavelengths) that correspond to the overall distribution and vertical distance of these cavities. Thus, in quantum matching, the relative concentration and distribution of nanoparticles within each of one or more layers of the DBR structure has impact on both the index of refraction of the Si/SiO2 layer and on the range of spectral shifting that is obtained.

According to an embodiment of the present disclosure, two different layers alternate in the DBR coating 40 structure:
  (i) layers 60 in the layered arrangement shown in FIG. 5 are formed of an engineered material having a distribution of Si particles within an SiO2 substrate; and
  (ii) alternate layers 66 are formed of another transparent, conducting material such as indium-tin oxide (ITO). Alternative materials that can also be used include various types of doped binary compounds, including aluminum-doped zinc oxide (AZO), indium-doped cadmium oxide, and aluminum, gallium, or indium-doped zinc oxide (AZO, GZO, or IZO), for example.

Materials used for providing substrate and nanoparticle components are selected for suitability for forming vertical cavities of appropriate geometry for the target wavelengths.

Structure and Composition of SERS Layer 46

Referring back to the schematic diagram of FIG. 4, SERS layer 46 forms a wavelength conversion engine that provides additional wavelength shift to the incoming light, following conveyance of the light and initial shifting of wavelength through Bragg reflector section 44.

Regarding the down-conversion of photons with scattering and Stokes shift, it has been shown that near resonant Raman scattering, given an ultraviolet (UV) or visible (VIS) excitation source such as 325 nm excitation source, gives rise to T2 (LO) peaks in the infrared (IR) energy region. Thus, for example, the 325 nm source can generate peaks within a region of interest 600 nm to 1050 nm. The intensity of the generated T2(LO) peaks increases with ZnS nanoparticle size from 6 nm to 30 nm.

In an embodiment, the surface enhanced Raman effect causes the UV and VIS in the range of 350 nm to 450 nm to excite T2(LO) peaks in the 600 nm to 1000 nm region as a result of Raman shift (Stokes shift). This shift may be caused by the change in bandgap energy caused by the quantum confinement and free exciton emission energy created by surface plasmons. The ZnS metal nano-particles provide the necessary plasmonic energy for the Stokes shift and hence do not cause loss in the energy of the shifted photons emitted in the region of interest.

Raman scattering is a result of formation of a dipole cloud from electrons of the molecular materials. Spectral shifting and surface enhancement of the Raman scattered signals results from the distribution of conductive nanoparticles of appropriate materials, such as silver, gold, and zinc, for example, within the substrate that forms an SERS layer 46. By appropriate selection of materials and their distribution, the SERS layer 46 can be configured to exhibit localized surface plasmon resonance (LSPR) to provide spectral shifting toward a suitable wavelength range. The term "conductive" used herein refers to having a relatively low volume resistivity, e.g., without limitation, a typical conductive material has a volume resistivity that is less than $10^2$ Ohm-m at 20° C. Volume resistivity relates to the ability of a material to oppose the flow of electric current.

Propagation of light through a medium with a sparse distribution of embedded nanocrystals can be approximated by computing the effective refractive index of a homogeneous medium, computed as:

$$\bar{m} = m\left[1 + i\frac{2\pi\rho}{k^3}S(0)\right]$$

wherein:
m=refractive index of the light-conveying medium in which nanoparticles are embedded;

$$k = \frac{\omega}{c}$$

wavenumber in the medium;

$$\rho = \frac{N}{V}$$

number of particles N divided by the volume V;
S(0) is the scattering amplitude in the forward direction;

The absorption coefficient, wherein the absorption medium has complex refractive index is generally:

$$\alpha = 2k\, I_m\bar{m}$$

For a thin layer with small, identical nanoparticles the absorption coefficient can be given by:

$$\alpha = \frac{m4\pi\rho}{k^2}$$

$$R_e S(0) = \rho m c_{ext}$$

wherein $c_{ext}$ is the extinction cross section of a single particle, proportional to the real part of the scattering amplitude $R_e\, S(0)$.

According to Beer's law, the attenuation of a collimated beam propagating through the effective medium over a distance h is obtained using:

$$I(h) = I(0)e^{-hm\rho C_{ext}}$$

wherein I is the intensity.

Wavelength shifting occurs due to interaction between competing processes, as described in the article by van Dijk et al. entitled "Competition between Extinction and Enhancement in Surface-Enhanced Raman Spectroscopy" in *Physical Chemistry Letters, American Chemical Society*, 2013. pp. 1193-1196 and incorporated herein by reference. SERS operates to cause extinction of the resonant signal at plasmon frequencies for the nanoparticles, with corresponding enhancement of the Raman scattered signal at a distance from the resonant wavelength. This counter-intuitive behavior, with diminished Raman signal when nanoparticles are excited at plasmon resonance, can be adapted to provide up-conversion of the incident light to longer wavelengths, which is typically the behavior desired for PV applications. Alternately, SERS can be used to effect down-conversion of the incident light to shorter wavelengths, as well as for wavelength band matching.

Among factors that can be controlled in order to adjust the wavelength and intensity of the Raman scattered light energy are nanoparticle type, shape, overall size, and concentration/distribution. Design of spectral response with SERS structures is described, for example, in an article by A. Bouali, S. Haxha, F. Abdelmalek, M. Dridi, and H. Bouchriha entitled "Tuning of Plasmonic Nanoparticle and Surface Enhanced Wavelength Shifting of a Nanosystem Sensing Using 3-D-FDTD Method" in *IEEE Journal of Quantum Electronics* Vol. 50, No. 8 (August 2014), pp. 651-657, incorporated herein by reference.

A plasmon resonant material scatters incident light over a frequency spectrum that is characteristic of the material's particle diameter, size, and dielectric attributes of the surrounding substrate. Resonantly scattered light for some materials can increase the wavelength, such as to provide a "red-shift", to incident light.

A feature of plasmon creation in a metallic particle is the generation of enhanced electric fields in the region near its surface. Interactions between this electric field and nearby materials can significantly alter both the scattering characteristics of the resonant particle and the nearby material. Surface Enhanced Raman Spectroscopy (SERS) exploits the localized plasmon resonance in particle-coated films, engineered to enhance Raman scattering by a few orders of magnitude. Using this technique, Raman scattering from the materials of interest can be observed; the local field generated by the plasmon can be used to enhance the intensity of that scattering.

According to an embodiment of the present disclosure, SERS layer 46 is formed of metallic nanoparticles formed of zinc oxide (ZnO) or other transparent, conductive metal, embedded within a transparent, conductive base material or matrix. According to an embodiment of the present disclosure, ITO is the conductive base material. A number of types of metallic nanoparticles can be used for obtaining plasmon response in SERS layer 46, depending on the amount of wavelength shifting that is required. Suitable metallic nanoparticles can include noble metals such as gold and silver, and metals with favorable qualities for low reactivity and high reflection, including cobalt, and chromium, for example. Various compounds such as zinc nitrate can alternately be used. As is known to those skilled in the quantum electronics arts, the amount of spectral shift that is provided can be engineered into the material, such as by applying a suitably designed coating. The spectral shift that is achieved can be, in part, a factor of nanoparticle size and distribution and of the complex index of refraction of the base material or matrix.

It should be noted that the use of various types of nanoparticles and control of their relative sizes and distributions within the different layers of the film or coating of the present disclosure allows adjustment of light wavelengths that enables use for up-conversion, down-conversion, or wavelength band matching.

Fabrication of Down-Conversion Film

For solar energy conversion applications, for example, the Applicant has found that a down-conversion coating or film 40 can be formed using the arrangement described previously to provide suitable wavelength shifting that conditions incident sunlight to wavelengths that are more favorable for efficient conversion by PV devices.

With respect to the layered arrangement shown in FIGS. 4-6, fabrication steps begin with cover 42, which can be a transparent glass or plastic substrate, then form the layers of the Bragg reflector section 44 onto cover 42, followed by formation of SERS layer 46.

Steps for forming coating 40 onto cover 42 as a base can use the following sequence:

(i) Form a first layer 66 using sputtering or other deposition technique to deposit 50 nm of ITO or other conductive, light-conveying material.

(ii) Sputter or otherwise deposit a thin layer of Si onto layer 66.

(iii) Use sintering or annealing to form nanocrystals from the deposited Si layer. According to an embodiment, sintering temperatures in the 600-800 degrees C. range form Si nanocrystals of suitable size and distribution for forming layer 60 with a given index of refraction that differs from that of the ITO layer and having desired nanocrystal distribution for forming vertical cavities for Bragg reflection at suitable wavelengths.

(iv) Form an embedding layer by depositing ITO or other conductive, light-conveying material onto the nanocrystals formed.

(v) repeat steps (i)-(iv) two or more times to form Bragg reflector section 44.

(vi) Form the SERS layer by applying a conductive, transparent base, such as ITO, and embedding or otherwise distributing ZnO onto the base.

(vii) Form nanoparticulate ZnO particles with suitable distribution for generating SERS.

There are a number of known methods for forming nano-optical coatings. These methods include, but are not limited to, roll coating, spin coating, physical vapor deposition, chemical vapor deposition and magnetron plasma sputtering. Roll coating has disadvantage of using a filler formed of polymer binders and fillers that degrade when exposed to sunlight.

Magnetron plasma sputtering is used for nano-optical coatings of inorganic, long-lasting metal oxides, such as, $TiO_2$, $SiO_2$, $MgF_2$, for example. This technique allows in-line processing, with the capability to sputter a large number of glass sheets within favorable cycle times. The magnetron plasma sputtering technique builds the nano-optical coating layer-by-layer, as an additive fabrication process.

The diagram of FIG. 6 shows a sequence for additive fabrication and forming in situ nanoparticles within the coating. From left to right, sputtering is used to apply the material and related oxide to a substrate (at the sample position). An annealing process, under controlled conditions such as in a $N_2/O_2$ atmosphere, is then used to condition the coating to its substrate. Temperatures for annealing are, without limitation, typically in the 900-1200 degree C. range. The resulting nanoparticles can be tested and used to provide the desired transmissive and reflective properties.

For nano-particle inclusion in the matrix of the transparent material, such as within Transparent Conducting Oxides (TCO), for good contact at the top and bottom surface of the single junction c-Si solar cells, thermal annealing can be obtained. Thermal annealing of the sputtered layer of metal oxide to create in-situ nanocrystals, again using an additive manufacturing process, allows improved control; applying the annealing temperature and pressure, using methods familiar to those skilled in the materials art, allows the precise control of size and density of the nanocrystal active layer.

The additive manufacturing sequence described is suitable for in-line, high throughput processing. Quartz heaters can be incorporated within the sputtering chamber.

According to an embodiment, there is a sequence of steps that combines nano-particles suitably structured and embedded in metal oxides to achieve a band-pass of 700 to 1100 nm and a low percentage of the down-shifting of high-energy photons of 300 nm to 600 nm wavelength towards 800 nm to 900 nm lower-energy photons, more suitable for PV and other applications. Transmittance and reflectance spectra for the experimental coating has been validated by independent testing. Outdoor testing, for example, indicates a gain of efficiency for a 72-cell full size solar panel, with overall improvement averaging from 15% to 22% in solar panel efficiency based on field trials.

Figure 7:
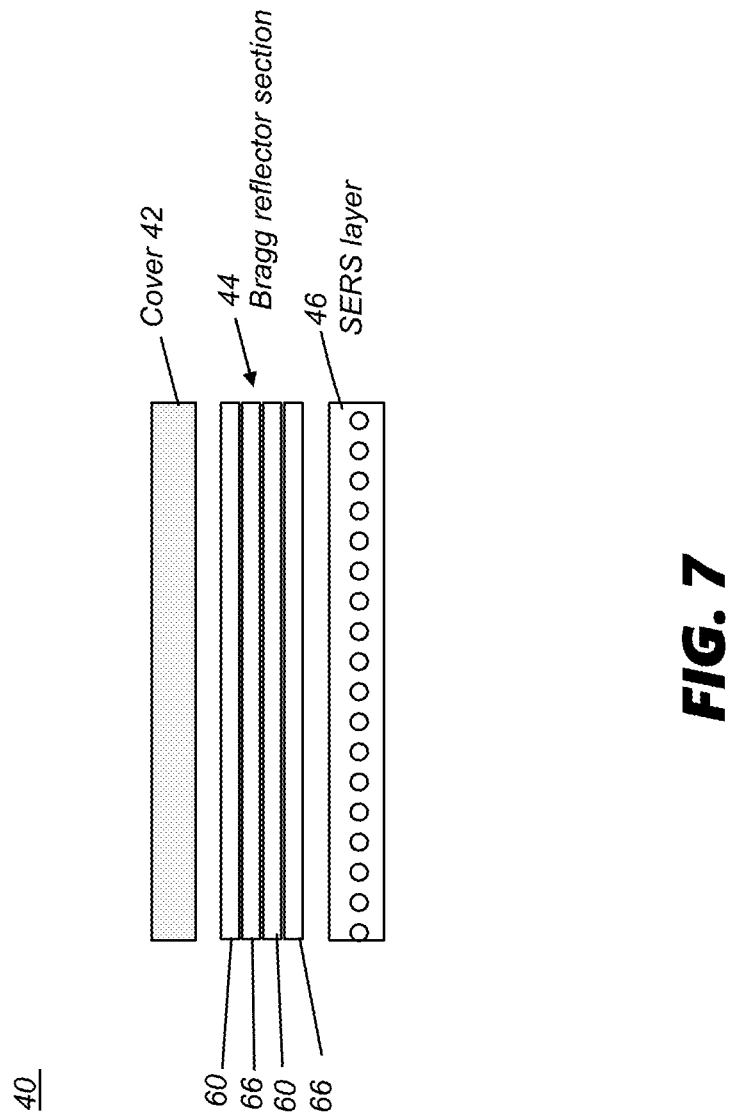
FIG. 7 is a cross-sectional, partially exploded view that shows the layered arrangement used for a transparent down-conversion (DC) film or coating that is formed according to an embodiment of the present disclosure.

The cross-sectional, exploded view of FIG. 7 shows the layered arrangement used for a transparent down-conversion (DC) film or coating 40 that is formed according to an embodiment of the present disclosure and not to scale. Film or coating 40 can be fabricated in rolled or sheet form, then applied to a PV device surface or other substrate surface or component using an optical adhesive, such as EVA (ethylene-vinyl acetate), for example.

According to an embodiment of the present disclosure, the substrate can be a low-iron solar glass, such as solar glass products manufactured by Gujarat Borosil Ltd., Gujarat, India.

Layers can be formed on the light-propagating substrate by any of a number of suitable methods, such as by physical or chemical vapor deposition. Sintering and annealing processes can be executed under high vacuum or in an oxygen-free environment, for example.

The film 40 of FIG. 7 can be used as a separate optical article or can be adhered or otherwise coupled to another optical material in order to provide wavelength conversion.

According to an alternate embodiment of the present disclosure, film 40 as shown in FIG. 7 and described herein can be formed on a film substrate for application to glass or other optical material or component. Alternately, the layers that form film 40 can be formed directly onto a surface of a light-propagating material or photonic component for improved spectral efficiency and response.

Although described in an embodiment for down-conversion function, the apparatus and methods of the present disclosure can alternately be applied, with suitable changes in material types, distribution, and size, for up-conversion, as well as for shifting of light energy to a preferred wavelength range.

According to an embodiment of the present disclosure, an optical coating has a set of layers formed to reflect a predetermined range of wavelengths, the set of layers including two or more pairs of alternating first and second layers, the first layers having a first refractive index, $n_1$, and the second layers having a second refractive index, $n_2$, greater than the first refractive index $n_1$, wherein the second layers each include a first distribution of nanoparticles of a first material, wherein the layers exhibit a spectral characteristic, typically shown by a graph that plots light volume or energy against wavelength, that shifts a portion of the incident light wavelengths to a first range of wavelengths and that directs light of the first range of wavelengths to a surface-enhanced Raman scattering layer. The surface-enhanced Raman scattering layer is configured with a second distribution of conductive nanoparticles of a second material to further shift the light of the first range of wavelengths to a second range of wavelengths different from the first range, according to the second distribution of nanoparticles in the Raman scattering layer. The spectral characteristic of the layers can be provided by reflective cavities formed within the first distribution of nanoparticles. The first material can be silicon; the second material can be a conductive metal. The coating can be formed as a film.

An optical coating in accordance with an embodiment of the present disclosure can have a distributed Bragg reflector section that is configured to reflect a target wavelength; and a surface-enhanced Raman scattering section that is adjacent to the DBR section and is configured to accept light of the target wavelength from the DBR section and generate light that is spectrally shifted from the received light.

The invention has been described in detail, and may have been described with particular reference to a suitable or presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

The invention claimed is:

1. An optical coating comprising:
a set of layers formed to reflect a predetermined range of wavelengths, the set of layers including two or more pairs of alternating first and second layers, the first layers having a first refractive index, $n_1$, and the second layers having a second refractive index, $n_2$, greater than the first refractive index $n_1$,
wherein the second layers each include a first distribution of nanoparticles of a first material,
wherein the set of layers exhibit a spectral characteristic that shifts a portion of incident light wavelengths to a first range of wavelengths and that conveys light of the first range of wavelengths to a surface-enhanced Raman scattering layer;
wherein the surface-enhanced Raman scattering layer is configured with a second distribution of nanoparticles of a second material to further shift the light of the first range of wavelengths to a second range of wavelengths different from the first range, according to the second distribution of nanoparticles in the Raman scattering layer.

2. The coating of claim 1 wherein the spectral characteristic of the set of layers is provided by reflective cavities formed within the first distribution of nanoparticles.

3. The coating of claim 1 wherein the first material is silicon.

4. The coating of claim 1 wherein the second distribution of nanoparticles includes conductive nanoparticles.

5. The coating of claim 1 wherein the second material is a conductive metal.

6. The coating of claim 5 wherein the second material is taken from the group consisting of silver, gold, and zinc.

7. The coating of claim 1 wherein the second material is zinc nitrate.

8. The coating of claim 1 formed as a film.

9. The coating of claim 1 wherein the first range of wavelengths is below 600 nm.

10. The coating of claim 1 wherein the second range of wavelengths is above 800 nm.

11. The coating of claim 1 further comprising a cover layer formed from a light-propagating material.

12. An optical coating comprising:
a cover layer formed of a transmissive material;
a multilayer distributed Bragg reflector section adjacent the cover layer and configured to receive light of an incident light range and to reflect light of a target wavelength range; and
a surface-enhanced Raman scattering section that is adjacent to the distributed Bragg reflector section and is configured to accept light of the target wavelength range from the distributed Bragg reflector section and provide output light that is spectrally shifted from the received light.

13. The coating of claim 12 wherein the output light has higher energy at IR wavelengths above 700 nm than does the incident light over IR wavelengths.

14. The coating of claim 12 applied to a glass substrate.

15. The coating of claim 12 formed as a film.

16. The coating of claim 12 wherein the surface-enhanced Raman scattering section comprises a distribution of ZnO nanoparticles.

17. The coating of claim 16 wherein the ZnO nanoparticles are within a matrix formed of a transparent conducting oxide.

18. A method for forming an optical coating comprising:
    (a) forming a set of layers onto a substrate, wherein the set of layers is configured to exhibit a spectral characteristic that shifts a portion of incident light wavelengths to a first range of wavelengths by repeated steps of:
        (i) depositing a first layer having a first refractive index, $n_1$,
        (ii) depositing a second layer having a second refractive index, $n_2$, greater than the first refractive index $n_1$, and providing the second layer with a first distribution of nanoparticles of a first material,
    (b) forming a surface-enhanced Raman scattering layer configured with a second distribution of nanoparticles of a second material to receive light of the first range of wavelengths,
    wherein the surface-enhanced Raman scattering layer provides a further shift of the received light of the first range of wavelengths to a second range of wavelengths different from the first range, according to the second distribution of nanoparticles in the Raman scattering layer.

19. The method of claim 18 wherein the substrate is glass.

* * * * *